United States Patent [19]
Mikoshiba et al.

[11] 4,254,388
[45] Mar. 3, 1981

[54] FREQUENCY SELECTOR APPARATUS

[75] Inventors: Nobuo Mikoshiba, Sendai; Shoichi Minagawa; Takeshi Okamoto, both of Toda, all of Japan

[73] Assignee: Clarion Co., Ltd., Tokyo, Japan

[21] Appl. No.: 74,626

[22] Filed: Sep. 12, 1979

[30] Foreign Application Priority Data

Sep. 22, 1978 [JP] Japan .............................. 53-117010

[51] Int. Cl.³ ..................... H01L 41/04; H01L 27/20; H03H 9/64
[52] U.S. Cl. .................................... 333/195; 330/4.9; 333/149; 333/194; 357/26
[58] Field of Search ................................ 333/193–196, 333/150–155, 149; 331/107 DP, 107 A; 330/3.5, 4.5, 4.9, 4.6; 357/26; 364/821; 332/2, 21, 26, 52

[56] References Cited

U.S. PATENT DOCUMENTS

| | | | |
|---|---|---|---|
| 3,925,653 | 12/1975 | Otto | 333/154 X |
| 4,162,466 | 7/1979 | Hunsinger et al. | 333/194 |

*Primary Examiner*—Marvin L. Nussbaum
*Attorney, Agent, or Firm*—Blanchard, Flynn, Thiel, Boutell & Tanis

[57] ABSTRACT

A frequency selector apparatus wherein unidirectional input and output surface-acoustic-wave transducers are provided in an acoustic wave propagation path formed on a piezoelectric device and reflecting electrodes, to which a.c. signals are applied respectively, are disposed in the acoustic wave propagation path on opposite sides of the transducers and adjacent thereto.

5 Claims, 2 Drawing Figures

FREQUENCY SELECTOR APPARATUS

TECHNICAL FIELD OF THE INVENTION

This invention relates to an improvement in a frequency selector apparatus using surface-acoustic-wave transducers.

BACKGROUND OF THE INVENTION

Heretofore, there has been known an arrangement as illustrated in FIG. 1 for a frequency selector apparatus which is capable of widening a variable frequency range and capable of remarkably improving a quality factor Q. In the figure, 1 is a signal input transducer, 2 a signal output transducer, 3 and 4 pump electrodes, 5 a piezoelectric layer, 6 an insulator layer, 7 a semiconductor substrate, 8 and 9 members for absorbing surface acoustic waves, 10 a pump power supply, 11 a d.c. blocking capacitor, 12 an a.c. blocking inductor and 13 a d.c. bias power supply.

The apparatus may be fabricated for example in such a manner that an insulator layer 6 such as a silicon dioxide layer ($SiO_2$) is formed on a semiconductor substrate 7 made of silicon (Si) etc. by thermal oxidation, a piezoelectric layer 5 such as a zinc oxide layer is formed on the insulator layer 6 by sputtering, and a metal such as aluminum (Al) etc. is deposited on the piezoelectric layer 5 to subsequently shape electrodes 1 to 4 by photoetching the metal. The electrodes 1 and 2 formed at the central portion of the piezoelectric layer surface are comb-shaped electrodes and function as a signal input and a signal output transducer, respectively.

On the other hand, the electrodes 3 and 4 adjacent to the electrodes 1 and 2, respectively, and disposed at peripheral portions of the piezoelectric layer 5 are pump electrodes as mentioned above. The pump electrodes 3 and 4 are connected to the d.c. bias power supply 13 through the a.c. current blocking inductor 12 and connected further to the pump power source 10 through the d.c. current blocking capacitor 11.

At opposite ends of an acoustic wave propagation path of the piezoelectric layer 5, there are provided the surface acoustic-wave absorbing members 8 and 9.

The material of the piezoelectric layer 5 is not limited to zinc oxide (ZnO) but it may be any piezoelectric material such as lithium niobate ($LiNbO_3$), aluminum nitride (AlN), cadmium sulfide (CdS), zinc sulfide (ZnS), etc. The semiconductor to be employed may be either p-type or n-type. The polarity of the d.c. power supply 13 for the bias voltage is determined depending on the type of the substrate so as to produce a suitable space charge layer capacity on the surface of the semiconductor substrate 7.

Though the insulator layer 6 is interposed as a stabilizing layer between the semiconductor substrate 7 and the piezoelectric layer 5 in the embodiment illustrated, the insulator layer 6 may be omitted depending on the material employed for the piezoelectric layer 5. The apparatus may alternatively be formed of a piezoelectric substrate with a semiconductor coating provided thereon.

In the arrangement as mentioned above, the d.c. bias power supply 13 applies a d.c. bias voltage to the pump electrodes 3 and 4 so as to produce a suitable space charge layer capacity on the surface of the semiconductor substrate at portions under the electrodes 3 and 4.

An output of the pump power source 10 for producing a pump voltage having a frequency $2f$, which is twice as much as a desired frequency, i.e., frequency f selected, is applied also to the pump electrodes 3 and 4 through the d.c. current blocking capacitor 11. As a result, the space charge layer capacity on the surface of the semiconductor substrate 7 is excited at a frequency $2f$ as of the pump voltage. Since the capacity varies depending on the voltage applied, it varies at a frequency $2f$.

When an electric input signal is supplied to a terminal 1' of the signal input transducer 1 having a sufficiently wide band, the input signal is converted into a surface acoustic wave signal and propagated along the surface of the piezoelectric layer 5 in the leftward and rightward directions as viewed in FIG. 1. Of the surface acoustic waves propagated in the leftward direction as viewed in FIG. 1 from the input transducer 1, a component having a frequency f is amplified while it is being propagated through the pump electrode 3 since the piezoelectric potential at the electrode 3 is subjected to a parametric interaction with the pump voltage due to the nonlinearity effect of the space charge layer capacity on the surface of the substrate. At the same time, surface acoustic wave is produced which is propagated rightwardly as viewed in FIG. 1 from the pump electrode 3. The wave has a frequency f and a level corresponding to the level of the input signal. This surface acoustic wave is propagated rightwardly as viewed in FIG. 1 and converted into an electric signal by the signal output transducer 2. Thus, a signal of desired frequency f is outputted from a terminal 2' of the transducer 2.

Similarly, of the surface acoustic waves propagated rightwardly as viewed in FIG. 1 from the input transducer 1, a reflected wave having a frequency f and a level corresponding to the level of a signal component of frequency f is propagated leftwardly as viewed in FIG. 1 from the pump electrode 4 and converted to an electric signal by the output transducer 2.

The surface acoustic waves reflected by the pump electrodes 3 and 4 are mainly formed of components of frequency f and have a level corresponding to that of the input signal and determined depending on the levels of the pump voltage and the bias voltage. The frequency characteristic of the output of the output transducer 2 is steep. Thus, there can be attained a frequency selection of extremely high quality factor Q.

On the other hand, a pass band center frequency f taken out from the output transducer 2 may be varied by varying the frequency $2f$ of the pump voltage of the pump power supply 10.

The surface acoustic waves passed through the pump electrodes 3 and 4 and propagated therefrom leftwardly and rightwardly respectively are absorbed by the surface-acoustic-wave absorbers 8 and 9, respectively.

The frequency selector apparatus as mentioned above would have the following disadvantages if an ordinary interdigital transducer (an interlocking comb-shaped transducer) is employed as the surface-acoustic-wave transducer.

Assuming that a pump power of a frequency fp is applied from the pump power supply 10 to the pump electrodes 3 and 4, an electric signal of a frequency fs applied to the terminal 1' of the input transducer 1 is converted into a surface acoustic wave by the transducer 1 and propagated leftwardly and rightwardly. An acoustic wave of a frequency fs propagated leftwardly causes, when passing through the pump electrode 3, a parametric interaction with a space charge layer capacity on the surface of the semiconductor substrate excited by the pump power and generates an acoustic wave of a frequency fi (fi=fp−fs) which travels rightwardly from the pump electrode 3. This acoustic wave again produces due to the parametric interaction, when passing through the pump electrode 4, a component having a frequency fs which travels leftwardly from the pump electrode 4.

Similarly, an acoustic wave of a frequency fs generated by the input transducer 1 and travelling leftwardly therefrom produces, when passing through the pump electrode 4, an acoustic wave of a frequency fi travelling leftwardly, which in turn produces, when passing through the pump electrode 3, an acoustic wave of a frequency fs travelling rightwardly. ;p As a result, the acoustic waves of frequencies fs and fi travelling rightwardly and leftwardly, respectively, exist concurrently in the acoustic wave propagation path. By ths reason, the output signal contains a signal having a frequency fs and a produced component having a frequency fi which interferes therewith. In particular, where an input signal has a frequency fs (fs=½fp), an output varies in level according to the phase relation between the pump frequency fp and the input signal.

SUMMARY OF THE INVENTION

It is therefore an object of the present invention to provide a frequency selector apparatus which is capable of eliminating the aforesaid disadvantages by employing a unidirectional transducer as surface-acoustic-wave transducer.

In accordance with the present invention, there is provided a frequency selector apparatus which comprises:

a piezoelectric device;

unidirectional input and output surface-acoustic-wave transducers each disposed in an acoustic wave propagation path on said piezoelectric device;

reflecting electrodes each disposed in said acoustic wave propagation path on opposite sides of said transducers adjacent thereto; and means for applying a.c. signals to said reflecting electrodes, respectively.

DESCRIPTION OF THE PREFERRED EMBODIMENT

Figure 1:
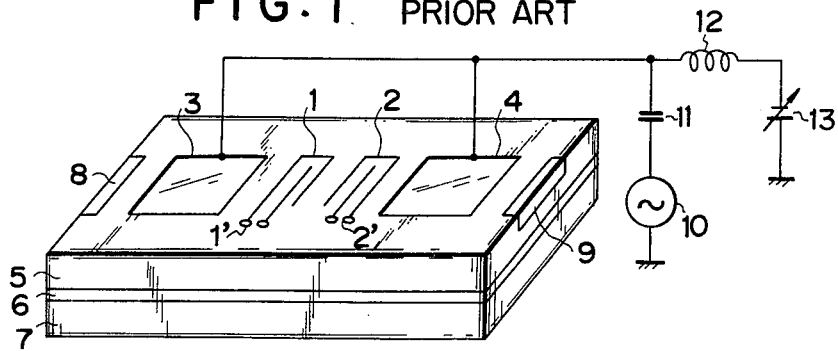
FIG. 1 is a schematic view of an arrangement for a known frequency selector apparatus.
Figure 2:
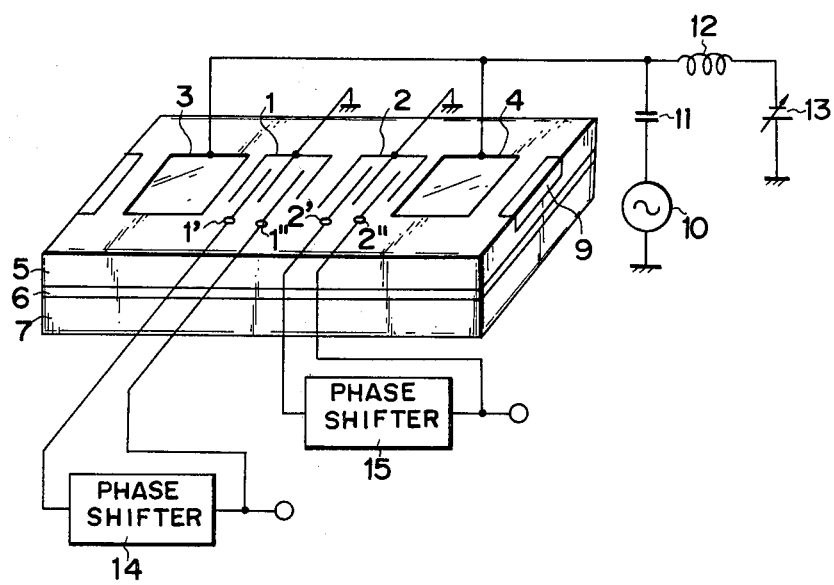
FIG. 2 is a schematic view of an arrangement for one form of a frequency selector apparatus according to the present invention.

An arrangement of a frequency selector apparatus according to the present invention illustrated in FIG. 2 essentially differs from the arrangement illustrated in FIG. 1 in that unidirectional transducers are employed for input and output surface-acoustic-wave transducers 1 and 2. More specifically, a phase shifter 14 is connected between electric signal input terminals 1' and 1" for providing a suitable phase difference between the terminals 1' and 1", so that the transducer 1 operates as a unidirectional transducer which produces an acoustic wave to be propagated only in the leftward direction. On the other hand, a phase shifter 15 is connected between electric signal output terminals 2', 2" of the output transducer 2 for providing a suitable phase difference between the terminals 2' and 2", so that the transducer 2 operates as a unidirectional transducer which converts the acoustic wave travelling only in the rightward direction into an electric signal.

According to the arrangement as mentioned above, the electric signal applied to the unidirectional input transducer 1 is converted into an acoustic wave and propagated only in the leftward direction. The acoustic wave produces due to a parametric interaction, when it passes through a pump electrode 3, an acoustic wave of a frequency fi(fi=fp−fs) travelling in the rightward direction. When this acoustic wave travels through a pump electrode 4, it produces again due to a parametric interaction a component of a frequency fs propagated leftwardly. This component is converted into an electric signal by the unidirectional output transducer 2. Thus, there is provided a resonator which is capable of eliminating interference of the component fi with the frequency fs.

As apparent from the foregoing discription, the present invention provides the following excellent effects:

(a) The quality factor Q is improved very much.

(b) The resonance center frequency can be varied by employing a pump power supply whose oscillation frequency is variable.

(c) The stability of the resonance frequency can be improved by employing a highly stable oscillator such as a crystal oscillator, a frequency synthesizer type oscillator, etc. because the stability of the resonance center frequency is determined by the stability of the pump frequency.

(d) Due to utilization of a parametric interaction, the output level can be varied by varying the pump power so that an amplified output can be obtained with a pump power larger than a certain value.

(e) The out-band response characteristic is excellent because components of frequencies other than frequencies around the resonance center frequency are not subjected to a parametric interaction and readily passed through the pump electrode as they are without being outputted.

We claim:

1. A frequency selector apparatus which comprises:
a piezoelectric device;
unidirectional input and output surface-acoustic-wave transducers each disposed in an acoustic wave propagation path on said piezoelectric device;
reflecting electrodes each disposed in said acoustic wave propagation path on opposite sides of said transducers adjacent thereto; and
means for applying an a.c. signal to each of said reflecting electrodes.

2. A frequency selector apparatus of claim 1, wherein said piezoelectric device is made of a laminate of a semiconductor layer and a piezoelectric layer.

3. A frequency selector apparatus of claim 1, wherein said unidirectional input surface-acoustic-wave transducer has a phase shifter connected between two input terminals thereof and said unidirectional output surface-acoustic-wave transducer has a phase shifter connected between two output terminals thereof.

4. A frequency selector apparatus of claim 1, wherein said means for applying said a.c. signals includes an oscillator whose oscillation frequency is variable.

5. A frequency selector apparatus of claim 1, wherein said means for applying said a.c. signals includes a highly stable oscillator.

* * * * *